(12) United States Patent
Kong

(10) Patent No.: US 10,424,252 B2
(45) Date of Patent: Sep. 24, 2019

(54) DISPLAY PANEL HAVING GATE DRIVER

(71) Applicant: LG Display Co., Ltd., Seoul (KR)

(72) Inventor: Chung Sik Kong, Paju-si (KR)

(73) Assignee: LG Display Co., Ltd., Seoul (KR)

(\*) Notice: Subject to any disclaimer, the term of this patent is extended or adjusted under 35 U.S.C. 154(b) by 54 days.

(21) Appl. No.: 15/618,030

(22) Filed: Jun. 8, 2017

(65) Prior Publication Data

US 2018/0190202 A1 Jul. 5, 2018

(30) Foreign Application Priority Data

Dec. 29, 2016 (KR) .................. 10-2016-0182506

(51) Int. Cl.
*G09G 3/3266* (2016.01)
*G06F 3/147* (2006.01)
(Continued)

(52) U.S. Cl.
CPC .......... *G09G 3/3266* (2013.01); *G06F 3/147* (2013.01); *G09G 3/002* (2013.01); *G09G 3/20* (2013.01); *G09G 3/2096* (2013.01); *G09G 3/3225* (2013.01); *G09G 3/3275* (2013.01); *G09G 3/3644* (2013.01); *G09G 3/3677* (2013.01); *G09G 3/3688* (2013.01); *G09G 2300/0413* (2013.01); *G09G 2310/0213* (2013.01); *G09G 2310/0221* (2013.01); *G09G 2310/0232* (2013.01); *G09G 2310/04* (2013.01);
(Continued)

(58) Field of Classification Search
CPC .... G09G 3/3266; G09G 3/002; G09G 3/2096; G09G 3/3225; G09G 3/3275; G09G 3/3644; G09G 3/3677; G09G 3/3688; G09G 2300/0413; G09G 2310/0213; G09G 2310/0221; G09G 2310/0232; G09G 2310/04; G09G 2310/062; G09G 2310/063; G09G 2310/067; G09G 2320/0223; G09G 2320/0252; G09G 2320/045; G09G 2330/023; G09G 2354/00; G09G 2310/08; G06F 3/147; G11C 19/28

See application file for complete search history.

(56) References Cited

U.S. PATENT DOCUMENTS

2006/0007102 A1\* 1/2006 Yasuoka ............... G02F 1/1336
345/102
2013/0009938 A1 1/2013 Hwang et al.
(Continued)

OTHER PUBLICATIONS

European Search Report for European Patent Application No. EP 17182793.4, Feb. 13, 2018, 15 pages.
(Continued)

*Primary Examiner* — Sahlu Okebato
(74) *Attorney, Agent, or Firm* — Fenwick & West LLP

(57) ABSTRACT

A display panel includes a substrate including a first area and a second area, a gate driver configured to supply a gate signal to pixels disposed on the substrate, a plurality of stages constituting the gate driver, and a first clock signal line and a second clock signal line to be respectively applied with a first clock signal and a second clock signal having the same phase. The plurality of stages are connected to the first area and the second area and driven at the same time. The first clock signal line and the second clock signal line are connected to each of the plurality of stages connected to the first area and the second area.

21 Claims, 11 Drawing Sheets

(51) Int. Cl.
    *G09G 3/00*           (2006.01)
    *G09G 3/20*           (2006.01)
    *G09G 3/3225*        (2016.01)
    *G09G 3/3275*        (2016.01)
    *G09G 3/36*           (2006.01)
    *G11C 19/28*         (2006.01)

(52) U.S. Cl.
    CPC .. *G09G 2310/062* (2013.01); *G09G 2310/063* (2013.01); *G09G 2310/067* (2013.01); *G09G 2310/08* (2013.01); *G09G 2320/0233* (2013.01); *G09G 2320/0252* (2013.01); *G09G 2320/045* (2013.01); *G09G 2330/022* (2013.01); *G09G 2330/023* (2013.01); *G09G 2354/00* (2013.01); *G11C 19/28* (2013.01)

(56)              References Cited

U.S. PATENT DOCUMENTS

2015/0138251 A1*   5/2015   Pyo ................ G09G 3/3233
                                                      345/690
2017/0154574 A1*   6/2017   Chaji ............... G06F 1/3218
2018/0061315 A1*   3/2018   Kim ................. G09G 3/3225

OTHER PUBLICATIONS

Partial European Search Report for European Patent Application No. EP 17182793.4, Oct. 12, 2017, 16 pages.
European Patent Office, Communication Pursuant to Article 94(3) EPC, EP Patent Application No. 17182793.4, dated Jun. 4, 2019, six pages.

* cited by examiner

DISPLAY PANEL HAVING GATE DRIVER

CROSS-REFERENCE TO RELATED APPLICATIONS

This application claims the priority of Korean Patent Application No. 10-2016-0182506 filed on Dec. 29, 2016, in the Korean Intellectual Property Office, the disclosure of which is incorporated herein by reference.

BACKGROUND

Field

The present disclosure relates to a display panel having a gate driver and more particularly, to a display panel having agate driver and configured to minimize a difference in stress applied to a gate driver connected to pixels which have been turned off for high-speed driving and a gate driver connected to pixels which have been turned on for a long time.

Description of the Related Art

Recently, the field of display devices for visually displaying electrical information signals has grown rapidly. Display devices have been used to watch, enjoy, and share not only simple images but also documents, pictures, videos, and the like. Further, there have been developed display devices that can provide users with virtual reality or augmented reality experiences by digitally playing images or videos back to the users so as to be felt real. Virtual reality (VR) refers to a technology that shows digital or virtual image information without visual input of the real world. Augmented reality (AR) is a kind of virtual reality and refers to a technology that synthesizes virtual image information based on the real world to be seen as an object present in its original environment.

Accordingly, various display devices such as a liquid crystal display (LCD) device, a plasma display panel (PDP) device, a field emission display (FED) device, an electro phoretic display (EPD) device, an electro-wetting display (EWD) device, and an organic light emitting display (OLED) device can be used to implement the VR or AR.

The above-described display devices are classified by kind of display panel. Various display panels include a pixel array that displays an image, a data driver that supplies a data signal to data lines connected to the pixel array, and a gate driver that sequentially supplies a gate signal to gate lines of the pixel array in synchronization with the gate signal.

Each pixel may include a thin film transistor (TR) that supplies a data line voltage to a pixel electrode in response to the gate signal supplied through the gate lines. The gate signal swings between a gate high voltage (VGH) and a gate low voltage (VGL). A P-type TFT is turned on in response to the VGL, and an N-type TFT is turned on in response to the VGH.

The gate driver may be mounted in the display panel together with the pixel array. The gate driver mounted in the display panel is known as a GIP (Gate In Panel) circuit. The GIP circuit includes a shift register, and stages constituting the shift register may generate an output in response to a start pulse and shift the output according to a clock signal.

The stages of the shift register include a Q node that charges a gate electrode, a QB (Q Bar) node that discharges the gate electrode, and a switch circuit connected to the Q node and the QB node. The switch circuit may increase a voltage of the gate electrode by charging the Q node in response to a start pulse or an output of a previous stage and discharging the QB node in response to an output of a subsequent stage or a reset pulse. The switch circuit may include a P-type or N-type TFT.

As described above, in order to implement the VR using various display devices, a plurality of pixels disposed in a screen needs to be driven at a high speed. To this end, a design of the GIP circuit has been researched.

SUMMARY

In one embodiment, a display device is disclosed for implementing VR needs to drive a screen at a higher driving speed than a normal driving speed of 60 Hz. A driving speed of 75 Hz or more is beneficial for high-speed driving. In an OLED device, a process of compensating for characteristics of a driving TFT for accurately applying a driving current depending on the grayscale of a pixel or compensating a pixel for minimizing deterioration of an organic light emitting diode is performed. Before pixels emit light, a compensating process is performed in real time during a sampling period. Thus, as the high-speed driving is performed, the sampling period is reduced. Therefore, a method of turning off pixels in an area out of a user's view in a partial area of a display device has been suggested in order to secure a compensation time. That is, in case of using the display device for normal use, all of pixels in the display device may be turned on, and in case of using the display device for implementing VR, pixels in an unnecessary area can be turned off.

A state where the display device is driven for normal use may be referred to a normal driving mode, and a state where the display device is driven for implementing VR may be referred to as a partial driving mode. In this case, when the display device is switched to the normal driving mode after the partial driving mode for a long time, line mura is generated at a boundary between a pixel area which has been turned on and a pixel area which is turned to on from off. The line mura is generated due to a difference in stress between a gate driver connected to pixels which have been turned on and applying a gate signal to the pixels which have been turned on and a gate driver connected to pixels which are turned to on from off and applying a gate signal to the pixels which are turned to on from off. That is, the gate driver connected to the pixels which have been turned on is further deteriorated than the gate driver connected to the pixels which are turned to on from off. Thus, the gate driver connected to the pixels which have been turned on outputs a relatively delayed waveform when generating an output waveform. The delayed waveform means that a rise time and a fall time of the output waveform are increased.

In this regard, one embodiment of the disclosure is a display panel having a gate driver to suppress the generation of line mura which may occur at the time of switch from the partial driving mode to the normal driving mode.

Accordingly, an object to be achieved by an embodiment of the present disclosure is to provide a display panel having a gate driver. In the display panel, stages of the gate driver connected to pixels turned off in a partial driving mode and stages of the gate driver connected to pixels remaining in an on state become similar in their degrees of deterioration.

Another object to be achieved by an embodiment the present disclosure is to provide a display panel having a gate driver. The display panel having a gate driver is configured to suppress the generation of mura caused by a change in load applied to a clock signal line.

The objects of one or more embodiments of the present disclosure are not limited to the aforementioned objects, and other objects, which are not mentioned above, will be apparent to a person having ordinary skill in the art from the following description.

According to an embodiment of the present disclosure, there is provided a display panel. The display panel comprises a substrate including a first area and a second area, a gate driver configured to supply a gate signal to pixels disposed on the substrate, the gate driver having a plurality of stages, and a first clock signal line and a second clock signal line to be respectively applied with a first clock signal and a second clock signal having a same phase. The plurality of stages are connected to the first area and the second area and driven at the same time. The first clock signal line and the second clock signal line are connected to each of the plurality of stages connected to the first area and the second area. Thus, the stages connected to the first area and the second area become similar in the degree of deterioration. And, it is possible to suppress the generation of line mura at a boundary between the first area and the second area at the time of switch from a partial driving mode to a normal driving mode.

According to another embodiment of the present disclosure, there is provided a display panel. The display panel comprises a substrate including a first area and a second area, a gate driver configured to supply a gate signal to pixels disposed on the substrate, the gate driver comprising a plurality of stages, and a first clock signal line configured to apply a first clock signal and a second clock signal line configured to apply a second clock signal to the gate driver. While pixels in the first area are in an off state, the first clock signal line is connected to one or more stages of the plurality of stages, the one or more stages connected to the pixels in the first area. Thus, the stages connected to the first area and the second area become similar in the degree of deterioration. And, it is possible to suppress the generation of line mura at a boundary between the first area and the second area at the time of switch from a partial driving mode to a normal driving mode.

According to another embodiment of the present disclosure, a display panel comprises a plurality of first pixel rows, a plurality of second pixel rows, a first clock signal line to carry a first clock signal, a second clock signal line to carry a second clock signal that is in phase with the first clock signal. A gate driver includes a plurality of first gate driver stages connected to the plurality of first pixel rows, and a plurality of second gate driver stages connected to the plurality of second pixel rows. A first gate driver stage of the plurality of first gate driver stages is driven at a same time as a second gate driver stage of the plurality of second gate driver stages. The first gate driver stage is connected to the first clock signal line and the second gate driver stage is connected to the second clock signal line.

Details of other embodiments will be included in the detailed description of the disclosure and the accompanying drawings.

According to an embodiment of the present disclosure, a first clock signal line to be applied with a first clock signal and a second clock signal line to be applied with a second clock signal having the same phase as the first clock signal but generated by an amplifier different from an amplifier that generates the first clock signal are disposed in a gate driver. Thus, it is possible to reduce load applied to the first clock signal line and the second clock signal line. Also, by driving stages connected to a first area and stages connected to a second area at the same time, the stages connected to the first area and the stages connected to the second area become similar in the degree of deterioration. Thus, it is possible to suppress the generation of line mura at a boundary between the first area and the second area at the time of switch from a partial driving mode to a normal driving mode.

Further, according to an embodiment of the present disclosure, a first clock signal line and a second clock signal line respectively connected to a plurality of stages connected to pixels disposed in a first area of a display panel and a plurality of stages connected to pixels disposed in a second area of the display panel are alternately connected to every m number of rows. Thus, it is possible to suppress the sharing of load applied to the first clock signal line and the second clock signal line. Also, by matching load applied to the first clock signal line with load applied to the second clock signal line, it is possible to suppress a delay of an output signal of a gate driver caused by a difference in load.

Furthermore, according to an embodiment of the present disclosure, a dummy stage is additionally disposed in a gate driver. Thus, when a first area and a second area respectively including different numbers of rows are driven in a partial driving mode, the dummy stage is operated after stages connected to the area including a smaller number of rows are completely operated. Therefore, two stages respectively connected to two lines within a frame are operated at the same time. Thus, it is possible to match the stages connected to the first area and the second area in delay of an output signal.

Moreover, according to an embodiment of the present disclosure, during a blank period between a frame as a period for driving an area where pixels are in anon state in a partial driving mode and its subsequent frame, a clock signal is applied to a plurality of stages connected to pixels in an off state. Therefore, while a plurality of stages connected to pixels in an on state are driven, there is no other stage being driven, and, thus, there is no effect on the stages connected to the pixels in an on state. Therefore, it is possible to suppress a delay of an output signal from a gate driver.

The objects to be achieved by the present disclosure, the aspects, and the effects of the present disclosure described above do not specify essential features of the claims, and, thus, the scope of the claims is not limited to the disclosure of the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
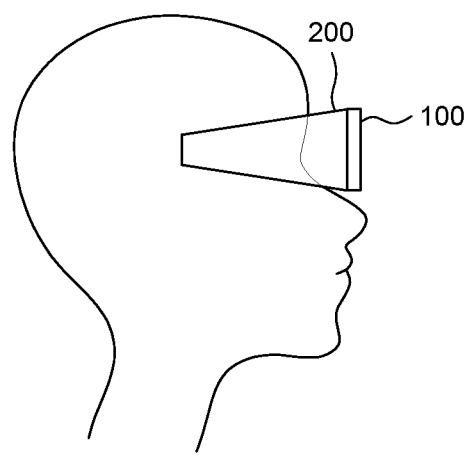
FIG. 1 is a diagram illustrating a user wearing a display device in which virtual reality is implemented.

Advantages and features of the present disclosure, and methods for accomplishing the same will be more clearly understood from embodiments described below with reference to the accompanying drawings. However, the present disclosure is not limited to the following embodiments but may be implemented in various different forms. The embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When the time sequence between two or more incidents is described using the terms such as "after", "subsequent to", "next to", and "before", two or more incidents may be inconsecutive unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely bonded to or combined with each other and can be interlocked and operated in technically various ways, and the embodiments can be carried out independently of or in association with each other.

Hereinafter, a display panel according to embodiments of the present disclosure will be described with reference to the accompanying drawings.

FIG. 1 is a diagram illustrating a user wearing a display device in which virtual reality is implemented.

Various display devices 100 described above can be used as virtual reality (VR) devices. In order to implement VR, it is necessary to show a spatial image depending on a position and a direction from the user. Therefore, it is better to use a light and small display device 100 which can be moved along with the movement of the user's head or eyes. Therefore, from among the display devices 100, a mobile or small-sized tablet PC may be used.

In order to use the display device 100 for viewing documents or videos as a VR device, the display device 100 needs to be fixed in front of the user's eyes. Therefore, a structure 200 for fixing the display device 100 is needed. The structure can be manufactured into various shapes using various materials, and can adjust a distance between the display device 100 and the user's eyes to properly implement VR.

That is, the user can use the display device 100 that the user is already using. Therefore, the user can easily enjoy VR contents without incurring additional costs for buying a VR device.

Figure 2:
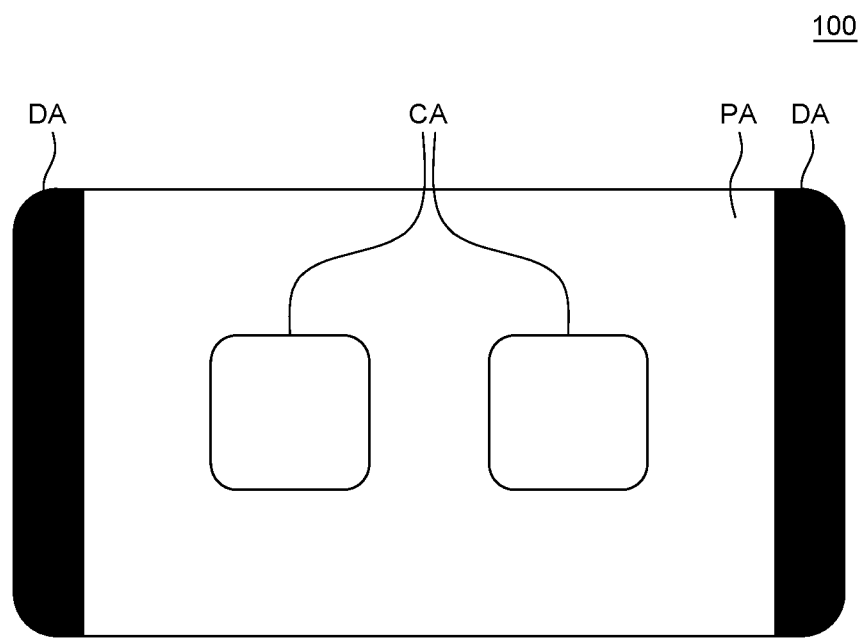
FIG. 2 is a diagram illustrating a display device according to an embodiment of the present disclosure.

FIG. 2 is a diagram illustrating a display device 100 according to an exemplary embodiment of the present disclosure.

Humans have a viewing angle of about 200° and an actual viewing range of 120° to 140°. Therefore, the display device 100 has central areas CA where the user's eyes are actually located when the display device 100 is fixed in front of the user's eyes and dark areas DA which cannot be recognized by the user who may see only a part of a peripheral area PA on both sides thereof. Further, a distance between the display device 100 and the user's eyes is decreased as compared with a case of using the display device 100 for normal use. Therefore, the user can more easily recognize the resolution of the display device 100.

That is, when the display device 100 is operated in a partial driving mode for implementing VR, pixels in the central areas CA should not have a dark spot or a bright spot and pixels in the peripheral area PA should have an image quality equivalent to or similar to an image displayed when the display device 100 is used for normal use. To this end, a display area of the display device 100 needs to be managed or controlled separately. Further, in the dark areas DA which cannot be recognized by the user, a black screen can be implemented by turning off pixels in the dark areas DA in order for the dark areas DA not to be displayed on a screen. Since a partial area of the display device 100 is actually not driven, power consumption can be reduced and the screen can be driven at a higher speed.

The display device 100 needs a driving speed of about 60 Hz for normal use and a driving speed of about 75 Hz or more for implementing VR. As a driving speed is increased, moving images are overlapped due to an image sticking effect and blurring of the moving images is worsened. Therefore, by reducing a persistence time of the images on the screen, it is possible to minimize the overlaps of the images and make the user recognize as if a response speed is high. The display device 100 has a persistence time of 16 ms at the time of driving at 60 Hz but has a short persistence time of 2 ms at the time of driving at 75 Hz or more, so that it is possible to suppress motion blur. This may be referred to as "Low Persistence (LP)". In the following, a method using this will be referred to as an LP mode, a VR mode, or a partial driving mode.

And, an organic light emitting panel is used in the display device 100 for implementing the partial driving mode. Thus, it is necessary to secure a sufficient time to perform real-time compensation of an organic light emitting diode and a driver for driving pixels. As a driving speed is increased, a display time of a frame on a screen is decreased and a driving time of each pixel is also decreased. Therefore, a pixel compensation time may not be sufficient. Accordingly, a necessary part of the screen may be driven and an unnecessary part may not be driven, so that a pixel compensation time can be secured. And, during high-speed driving, a pixel compensation time substantially equivalent to that for implementing a normal driving speed of 60 Hz can be maintained.

In case of using the display device 100 for normal use such as viewing images or watching videos, the display device 100 may be operated in a normal driving mode. In case of using the display device 100 for implementing VR, the display device 100 may be operated in the partial driving mode. In order to increase a driving speed and reduce a persistence time in the partial driving mode, the pixels in the dark areas DA are turned off, so that the screen can be readily driven at a high speed.

Although the display device for implementing VR has been described in the exemplary embodiments of the present disclosure, they can also be applied to a display device for implementing augmented reality (AR) or mixed reality (MR).

Figure 3:
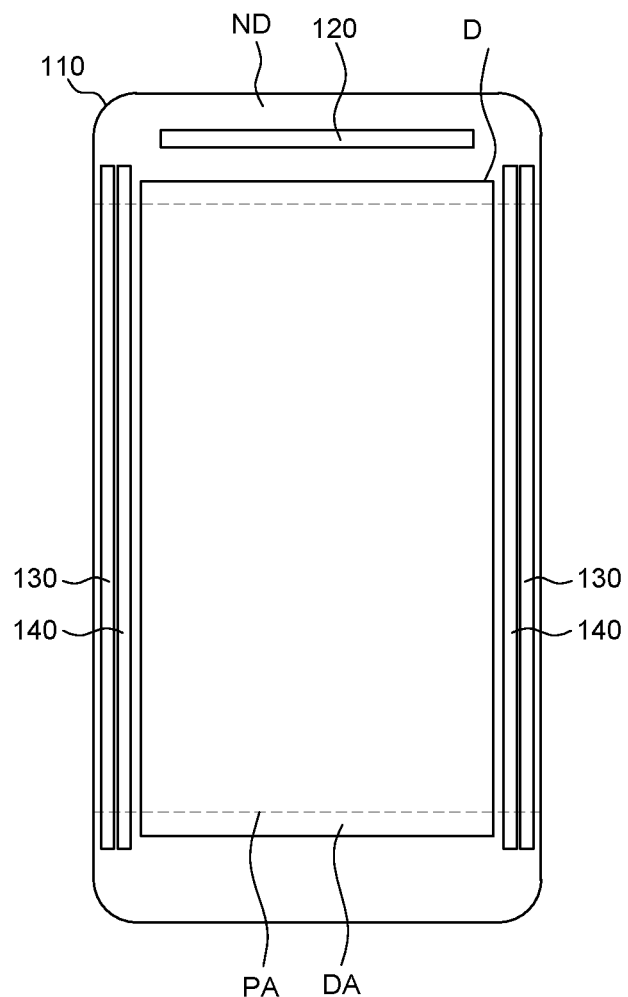
FIG. 3 is a diagram illustrating a display panel according to an embodiment of the present disclosure.

FIG. 3 is a diagram illustrating a display panel according to an exemplary embodiment of the present disclosure.

In order to implement the display device 100 illustrated in FIG. 2, the display panel illustrated in FIG. 3 may be used. The display panel includes a substrate 110 divided into a display area D where a plurality of pixels are disposed to display an image and a non-display area ND where an image is not displayed. In the non-display area ND surrounding the display area D, dummy pixels which do not emit lights may be disposed.

The plurality of pixels disposed in the display area D operate upon receipt of a data signal and a gate signal through a data line and a gate line, respectively. The data line may be applied with a signal as being connected to a data driver 120 disposed at an upper portion of the substrate 110. The data driver 120 may be manufactured in the form of a driver-ic and then attached on the substrate 110. However, a position or shape of the data driver 120 is not limited thereto.

The gate lines may include an emission line that controls agate electrode of a transistor configured to control emission of pixels. The emission line may be applied with an emission signal as being connected to an emission driver 140. The gate lines may include a scan line that controls a gate electrode of a switching transistor configured to switch a signal unlike the transistor configured to control emission of pixels. The scan line may be applied with a scan signal as being connected to a scan driver 130.

The scan driver 130 and the emission driver 140 are commonly referred to as a gate driver. The gate driver may be a GIP circuit directly formed on the substrate 110. The gate driver may be symmetrically designed on both sides, but is not limited thereto. Further, the gate driver may refer to the scan driver 130.

In the partial driving mode for implementing VR, the display panel needs to turn off pixels disposed in a partial area of the display area D. When VR is implemented, the user stares at the display panel illustrated in FIG. 3 in a state of being rotated 90 degrees clockwise or counterclockwise. Therefore, the user cannot recognize some areas of a left side and a right side of the display panel. That is, in the state as illustrated in FIG. 3, pixels disposed in partial areas of an upper portion and a lower portion of the display panel need to be able to be turned off. Therefore, the dark areas DA may be above and below the peripheral area PA including the central areas CA. In this case, the dark area DA disposed on an upper portion of the display panel includes some part of the display area D and may be referred to as a first area. The dark area DA disposed on a lower portion of the display panel includes some part of the display area D and may be referred to as a third area. The peripheral area PA including the central areas CA may be referred to as a second area.

In order for the display panel to be operated in the partial driving mode, when pixels in the second area are in an on state, pixels in the first area and the third area need to be turned off. Since a gate signal should not be supplied to the pixels in the first area and the third area, a gate driver connected to the pixels in the first area and the third area may be controlled not to generate an output signal. In detail, a gate start pulse voltage (GVST) and a clock signal to be input to the gate driver connected to the first area and the third area may be blocked. Thus, while the display panel is operated in the partial driving mode, the gate driver connected to the first area and the third area is not operated. However, when the display panel is switched to the normal driving mode after being driven in the partial driving mode as described above, line mura may be generated at a boundary between the first area and the second area and a boundary between the second area and the third area. While the gate driver connected to the first area and the third area is not driven, a gate driver connected to the second area is driven. Thus, a stress applied to the gate driver connected to the second area is higher than a stress applied to the gate driver connected to the first area and the third area. Therefore, the gate driver connected to the second area deteriorates more than the gate driver connected to the first area and the third area and a delay of an output signal generated from the gate driver connected to the second area is occurred. Accordingly, line mura may be generated at the boundary between the first area and the second area and the boundary between the second area and the third area.

In order to minimize the generation of line mura, a method of making the gate driver connected to the peripheral area PA and the gate driver connected to the dark areas DA similar or almost identical in the degree of deterioration may be applied. That is, in the partial driving mode, driving of the gate driver connected to the dark areas DA is not stopped, and while the gate driver connected to the peripheral area PA is driven, the gate driver connected to the dark areas DA is also driven.

As described above, the gate driver includes the scan driver 130 and the emission driver 140. A delay of an output signal output from the gate driver is more affected by the degree of deterioration of the scan driver 130 than by the degree of deterioration of the emission driver 140. This is because a turn-on time of a transistor of the scan driver 130 is longer than a turn-on time of a transistor of the emission driver 140 and a difference in voltage applied to the transistor of the scan driver 130 between drain-source, gate-source, or gate-drain is greater than a difference in voltage applied to the transistor of the emission driver 140. Therefore, by blocking the gate start pulse voltage (GVST) and the clock signal in the partial driving mode, the emission driver 140 is controlled not to be driven and the scan driver 130 is controlled to be driven. In this case, since the emission driver 140 is not driven, the pixels in the dark areas DA do not emit light.

Hereinafter, a method of driving the scan driver 130 connected to the dark areas DA in the partial driving mode to make the gate driver connected to the dark areas DA and the gate driver connected to the peripheral area PA similar or almost identical in the degree of deterioration will be described. In this case, when the pixels in the peripheral area PA are in an on state, the pixels in the dark areas are in an off state. The meaning of "the pixels are in an off state" may include "the pixels display black".

Figure 4A:
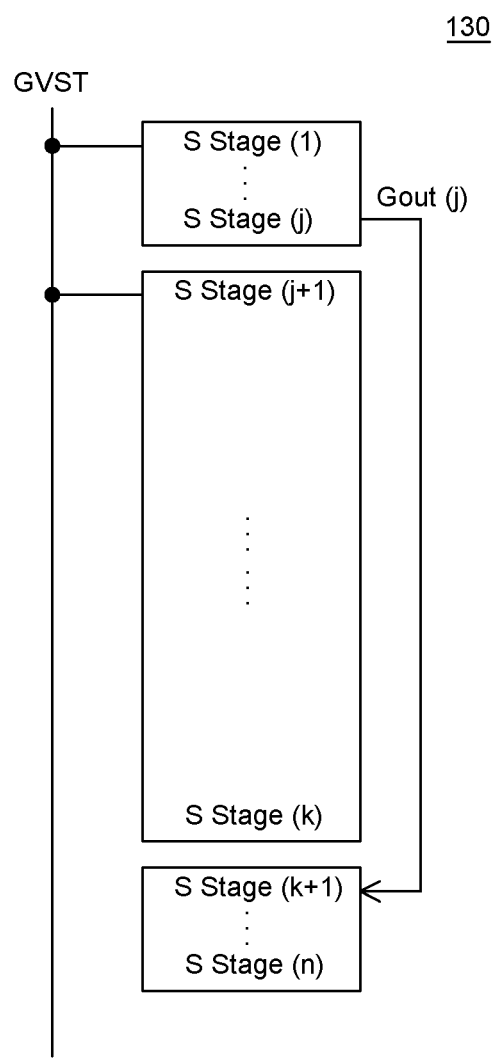
FIG. 4A is a block diagram illustrating a scan driver according to an embodiment of the present disclosure.

FIG. 4A is a block diagram illustrating the scan driver 130 according to an embodiment of the present disclosure. There may be various methods of operating the scan driver 130 connected to the dark areas DA while the partial driving mode is executed. FIG. 4A illustrates an embodiment thereof.

In the display panel on which pixels in n (n is a natural number) number of pixel rows are disposed, the gate driver includes n number of gate driver stages for sequentially transferring a signal to each pixel row is present. In detail, the gate driver includes the scan driver 130 and the emission driver 140. The scan driver 130 and the emission driver 140 include n number of scan stages S Stages and n number of emission stages, respectively. That is, pixels in each pixel row operate upon receipt of an output signal generated from a gate driver stage connected to each pixel row via a corresponding gate line. Hereinafter, the scan driver 130 that highly affects a delay of an output signal output from the gate driver as described above will be described. Herein, a stage is a component included in a driver, and, thus, the concepts of stage and the driver may be interchanged with each other.

A signal required to operate the scan driver 130 may include a gate clock signal, gate start pulse voltage (GVST), a gate high voltage (VGH), and a gate low voltage (VGL). In case these signals are applied to the scan stage S Stage as input signals, each stage generates an output signal to control driving of pixels disposed in each row. A connection relationship between the gate clock signal and the scan stage S Stage will be described later. Hereinafter, a connection relationship between an input of a signal required to operate the scan stages S Stages connected to the dark areas DA and the scan stages S Stages will be described.

The scan stages operate in a cascade manner in which each scan stage operates upon receipt of an output signal generated from its previous scan stage. Therefore, pixels disposed after some rows can be turned on by controlling or adjusting a signal to be input to a stage in a row to be turned on first.

For example, the dark areas DA include the first area where pixels in first to jth (j<n) pixel rows are disposed and the third area where pixels in (k+1)th to nth pixel rows are disposed. And, the peripheral area PA is the second area where pixels in (j+1)th to kth pixel rows are disposed. The pixel rows in the peripheral area PA are between the pixel rows in one dark area DA and the pixel rows in the other dark area DA. In this case, the total number of the pixel rows in the first area and the third area is smaller than the number of the pixel rows in the second area. That is, (j+n−k) is smaller than (k−j). And, when the pixels disposed in the second area are in an on state, the pixels disposed in the first area and the third area are in an off state.

Each scan stage is connected to a pixel row through a corresponding scan line. A scan line is an example of a gate line. Scan stages (1) to (j) are connected to pixel rows (1) to (j) via scan lines (1) to (j). Scan stages (j+1) to (k) are connected to pixel rows (j+1) to (k) through scan lines (j+1) to (k). Scan stages (k+1) to (n) are connected to pixel rows (k+1) to (n) through scan lines (k+1) to (n).

Scan stages S Stage (1) to S Stage (j) connected to the first area and scan stages S Stage (k+1) to S Stage (n) connected to the third area need to be driven while the pixels in the second area emit light. That is, a (j+1)th scan stage S Stage (j+1) connected to a (j+1)th row (which is a first row in the second area) and a first scan stage S Stage (1) connected to a first row in the first area may be driven at the same time. To this end, the first scan stage S Stage (1) in the first area and the (j+1)th scan stage S Stage (j+1) in the second area may be connected to a gate start pulse voltage line GVST line to be applied with the gate start pulse voltage (GVST). And, after driving of the first scan stage S Stage (1) to a jth scan stage S Stage (j) connected to the first area, a (k+1)th scan stage S Stage (k+1) connected to the third area may be driven. To this end, a signal line may be connected in order for an output signal Gout (j) of the last jth scan stage S Stage (j) connected to the first area to be input to the initial (k+1)th scan stage S Stage (k+1) connected to the third area.

Therefore, the scan stages S Stages connected to the first area and the third area can be driven at the same time when the scan stages S Stages connected to the second area are driven.

Figure 4B:
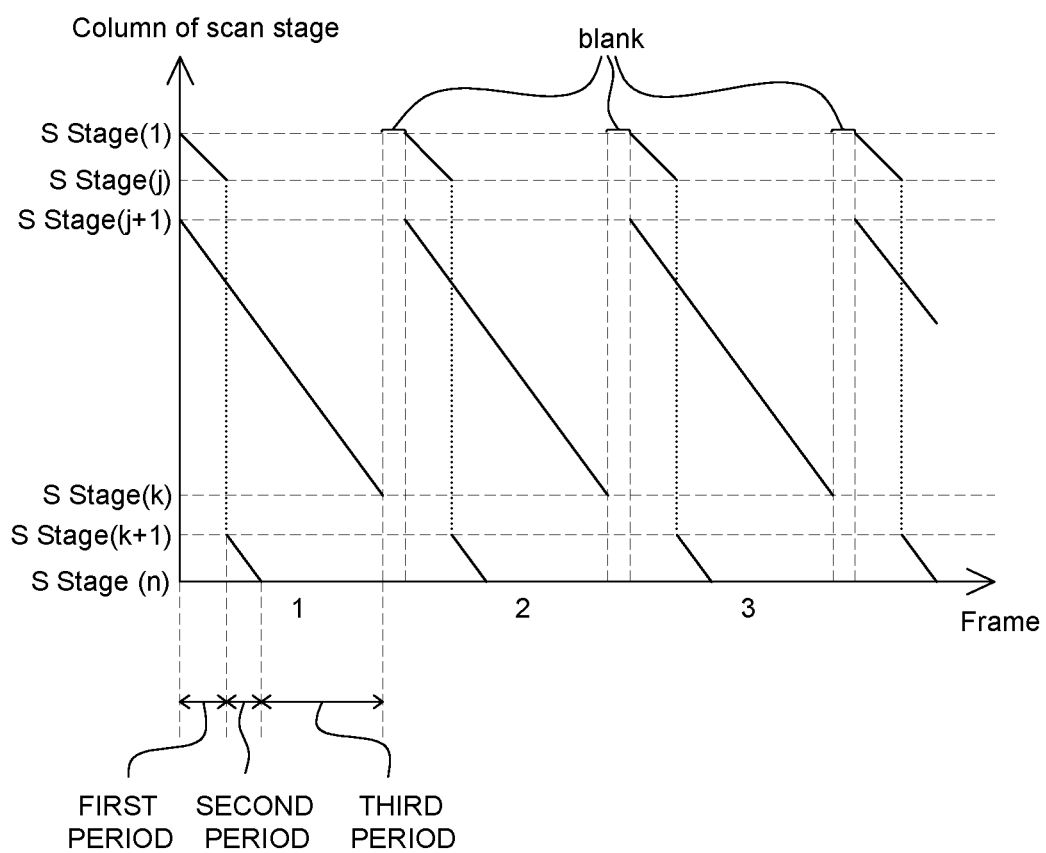
FIG. 4B is a graph illustrating a driving sequence of FIG. 4A.

FIG. 4B is a graph illustrating a driving sequence of the scan stage S Stage illustrated in FIG. 4A. In the graph, the horizontal axis represents a frame and the vertical axis represents a sequence of scan stages disposed in columns (Column of scan stage). That is, the top in the vertical axis represents the first scan stage S Stage (1) and the bottom in the vertical axis represents an nth scan stage S Stage (n).

The frame refers to a period in which a gate signal is sequentially applied to all of rows including an area to be displayed on a screen. A blank period is present between frames. The blank period refers to a period included when any display device is not driven. The blank period is present to adjust compatibility between an analog broadcasting signal and a digital display device. The blank period may be referred to as a preparatory period for preparing a subsequent frame.

Referring to FIG. 4B, a signal is simultaneously input to the scan stages connected to the first row and to the scan stages connected to the (j+1) th row and the scan stages are driven. During the first period, a signal is sequentially input to scan stages connected to 1st to jth rows (and so a pulse is sequentially driven to scan lines 1 to j). Also during the first period, a signal is sequentially input to scan stages connected to (j+1) th to (2j+1) th rows. At the beginning of the second period, the signal is simultaneously input to a scan stage connected to pixels disposed in a (k+1) th row and also input to a scan stage connected to pixels disposed in a (2j+2) th row. During the second period, a signal is sequentially input to scan stages connected to k+1 to nth rows (and so a pulse is sequentially driven to scan lines k+1 to n). Also during the second period, a signal is sequentially input to scan stages connected to (2j+2) th to (2j+1+n−k) th rows. During the third period, a signal is sequentially input to scan stages connected to (2j+2+n−k) th to kth rows. The first period, the second period, and the third period are collectively referred to as a first frame. After finishing the first frame, a blank period is present and then, a second frame is started.

That is, by driving the scan stages connected to the first area and the third area and the scan stages connected to the second area at the same time, it is possible to make the scan stages similar or almost identical in their degrees of deterioration. Also, it is possible to suppress a delay of an output signal which may occur in the scan stages connected to the second area. Therefore, it is possible to suppress the generation of line mura at the boundary between the first area and the second area and the boundary between the second area and the third area at the time of switch from the partial driving mode to the normal driving mode.

In addition to the description of the method of driving the scan stages illustrated in FIG. 4A and FIG. 4B, the first period and the second period refer to periods in which a signal is simultaneously input to two scan stages connected to two rows and then the two scan stages are simultaneously driven. And, the third period refers to a period in which only one scan stage is driven. For example, if a scan stage is driven using one clock signal, the clock signal needs to be input to two scan stages in the first and second periods and input to only one scan stage in the third period. That is, load applied to a clock signal line in the first and second periods is two times higher than load applied to a clock signal line in the third period. Therefore, the delay of the output signal generated from a scan stage occurs between the second period and the third period, and mura may be generated between the second period and the third period. In order to solve this problem, two clock signals having the same phase and generated by different amplifiers may be used. A method thereof will be described in detail with reference to FIG. 7 and FIG. 8.

Figure 5A:
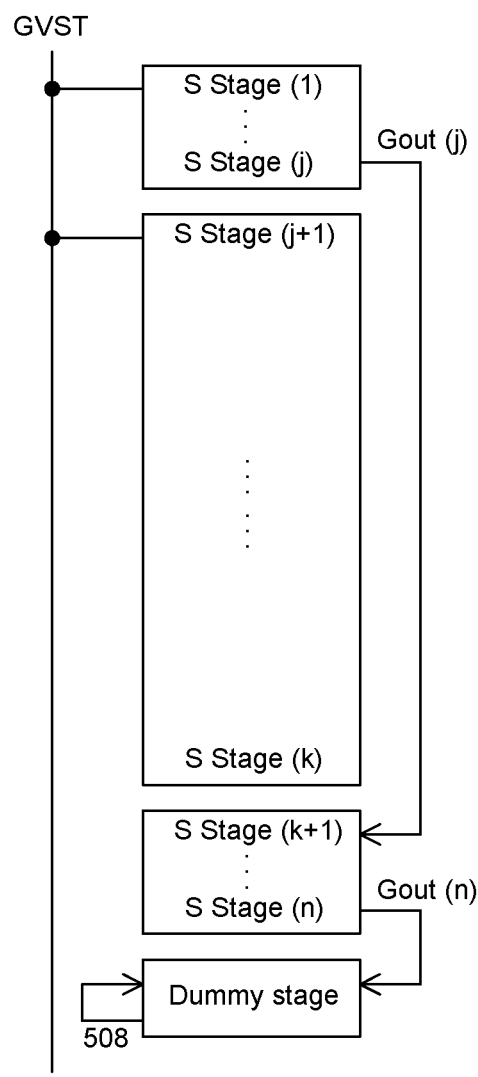
FIG. 5A is a block diagram illustrating the scan driver according to another embodiment of the present disclosure.

FIG. 5A is a block diagram illustrating the scan driver 130 according to another embodiment of the present disclosure. FIG. 5A is a modification example of the embodiment illustrated in FIG. 4A. Therefore, a description of the components illustrated in FIG. 4A will be omitted or briefly provided.

The scan driver 130 illustrated in FIG. 5A further includes a dummy stage in addition to the scan stages illustrated in FIG. 4A. In this case, the scan driver 130 may include a plurality of dummy stages. For example, the dark areas DA of the display panel include the first area where pixels in first to jth (j<n) rows are disposed and the third area where pixels in (k+1) th to nth rows are disposed. And, the peripheral area PA is the second area where pixels in (j+1) th to kth rows are disposed. In this case, the total number of the rows in the first area and the third area is smaller than the number of the rows in the second area. That is, (j+n−k) is smaller than (k−j). And, when the pixels disposed in the second area are in an on state, the pixels disposed in the first area and the third area are in an off state.

Scan stages S Stages connected to the first area and the third area need to be driven while scan stages connected to the second area are driven. That is, a (j+1) th scan stage S Stage (j+1) connected to a (j+1) th row which is a first row in the second area and a first scan stage S Stage (1) connected to a first row in the first area may be driven at the same time. To this end, the first scan stage S Stage (1) and the (j+1) th scan stage S Stage (j+1) may be connected to the gate start pulse voltage line GVST line to be applied with the gate start pulse voltage (GVST). And, after driving of the first scan stage S Stage (1) to a jth scan stage S Stage (j) connected to the first area, a (k+1) th scan stage S Stage (k+1) connected to the third area may be driven. To this end, a signal line may be connected in order for an output signal Gout (j) of the jth scan stage S Stage (j) to be input to the (k+1) th scan stage S Stage (k+1).

Referring to FIG. 5A, when the total number of rows in the first area and third area is different than a number of rows in the second area, the dummy stage is connected to stages for the area having a smaller number of rows (e.g. to the third area in FIG. 5A). Since the number of the rows included in the first area and the third area is smaller than the number of the rows included in the second area, a third period occurs in which only the scan stages connected to the second area are driven. Thus, a delay of an output signal onto the scan lines may be caused by stresses applied to the scan stages connected to the second area that are driven in the third period. Therefore, scan stages connected to two rows need to be driven in the third period in the same manner as first and second periods in order to adjust a delay time of an output signal. To this end, the dummy stage may be further disposed.

The dummy stage may be connected to a line in order for an output signal Gout (n) of the last nth scan stage S Stage (n) to be input to a first dummy stage. Also, if there are (a) number of dummy stages, a line 508 may be connected in order for an output signal of an ath dummy stage to be input to a first dummy stage. Thus, the dummy stages may be driven until all of the scan stages connected to the second area are driven.

Figure 5B:
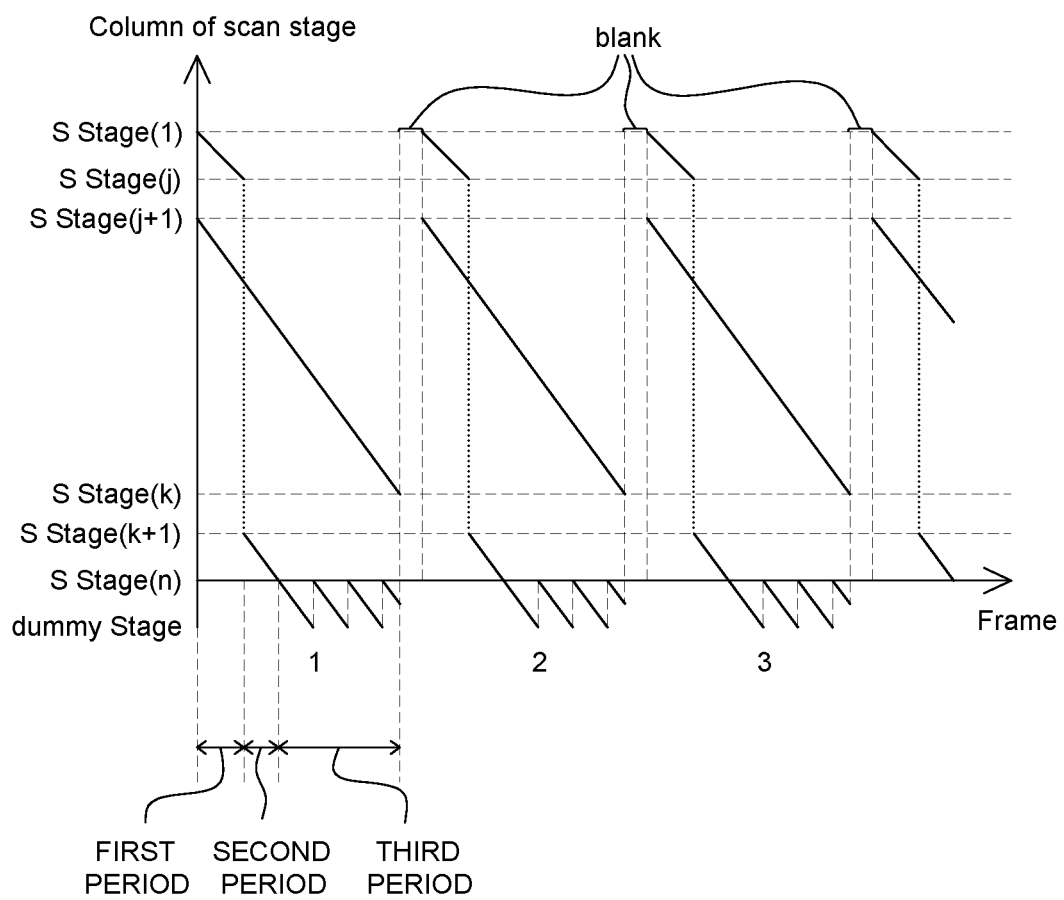
FIG. 5B is a graph illustrating a driving sequence of FIG. 5A.

FIG. 5B is a graph illustrating a driving sequence of the scan stage S Stage illustrated in FIG. 5A and is a modified example of the graph illustrated in FIG. 4B. Therefore, a description of the same components will be omitted or briefly provided.

The first and a second periods of FIG. 5B are driven in the same manner as the first and second periods of FIG. 4B. And, the dummy stage is repeatedly driven in the third period unlike the third period of FIG. 4B. That is, in all of the first period, the second period, and the third period of FIG. 5B, two scan stages connected to two rows are driven.

In detail, during the first period, a signal is simultaneously input to the scan stages connected to the first row and the (j+1)th row and the scan stages are driven. During the first period, a signal is sequentially input to scan stages connected to 1st to jth rows. Also during the first period, a signal is sequentially input to scan stages connected to (j+1) th to (2j+1) th rows. At the beginning of the second period, a signal is simultaneously input to a scan stage connected to pixels disposed in a (k+1) th row and also input to a scan stage connected to pixels disposed in a (2j+2)th row. During the second period, a signal is sequentially input to scan stages connected to k+1 to nth rows. Also during the second period, a signal is sequentially input to scan stages connected to (2j+2) th to (2j+1+n−k) th rows. And, during a third period, the dummy stage is repeatedly driven while the signal is sequentially input to scan stages connected to (2j+2+n−k) th to kth rows That is, by driving the scan stages and the dummy stage connected to the first area and the third area and the scan stages connected to the second area at the same time, it is possible to continuously operate scan stages connected to two lines at the same time in a frame. Thus, it is possible to make the scan stages similar or almost identical in their degrees of deterioration. And, it is possible to adjust a delay time of an output signal which may be generated in the scan stages connected to the second area.

Figure 6A:
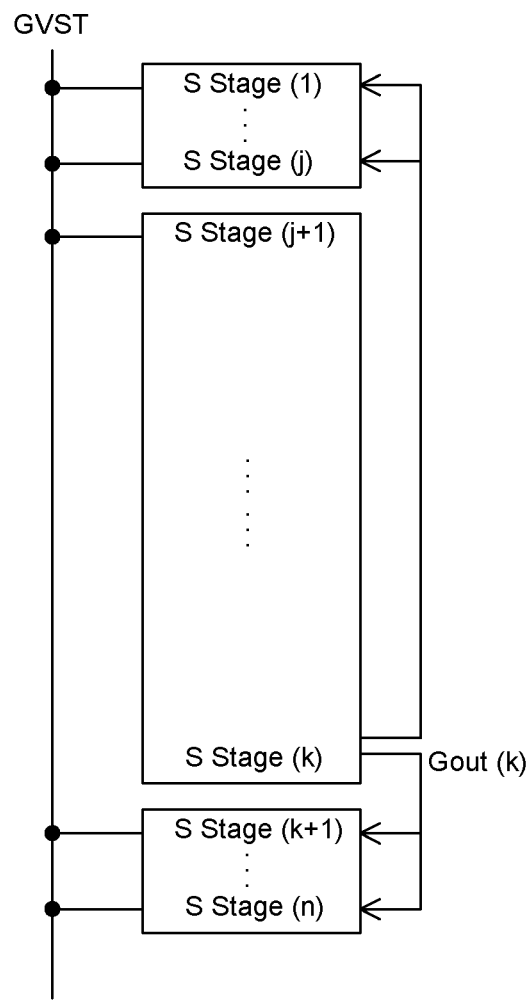
FIG. 6A is a block diagram illustrating the scan driver according to yet another embodiment of the present disclosure.

FIG. 6A is a block diagram illustrating the scan driver 130 according to another embodiment of the present disclosure.

The scan driver 130 illustrated in FIG. 6A is similar to the scan driver 130 illustrated in FIG. 4A in configuration except a connection relationship between scan stages. For example, the dark areas DA of the display panel include the first area where pixels in first to jth (j<n) rows are disposed and the third area where pixels in (k+1) th to nth rows are disposed. Further, the peripheral area PA is the second area where pixels in (j+1) th to kth rows are disposed. In this case, the total number of the rows in the first area and the third area is smaller than the number of the rows in the second area. That is, (j+n−k) is smaller than (k−j). And, when the pixels disposed in the second area are in an on state, the pixels disposed in the first area and the third area are in an off state.

Scan stages S Stages connected to the first area and the third area may be driven after scan stages in the second area are driven. That is, a line may be connected in order for an output signal Gout (k) of a kth scan stage S Stage (k) connected to a kth row which is a last row in the second area to be input to all of the scan stages S Stage (1) to S Stage (j) and S Stage (k+1) to S Stage (n) connected to the first area and the third area.

And, a first scan stage S Stage (j+1) connected to the second area and all of the scan stages connected to the first area and the third area may be driven. To this end, the first scan stage S Stage (j+1) in the second area, a first scan stage S Stage (1) to a jth scan stage S Stage (j) in the first area, and a (k+1) th scan stage S Stage (k+1) to an nth scan stage S Stage (n) in the third area may be connected to a gate start pulse voltage line (GVST line) to be applied with the gate start pulse voltage (GVST).

Therefore, after driving of the (j+1)th scan stage S Stage (j+1), which is the first scan stage connected to pixels disposed in a (j+1) th row (which is the first row in the second area), to the kth scan stage S Stage (k) connected to the kth row in sequence, scan stages connected to all of the rows in the first area and the third area may be driven at the same time.

Figure 6B:
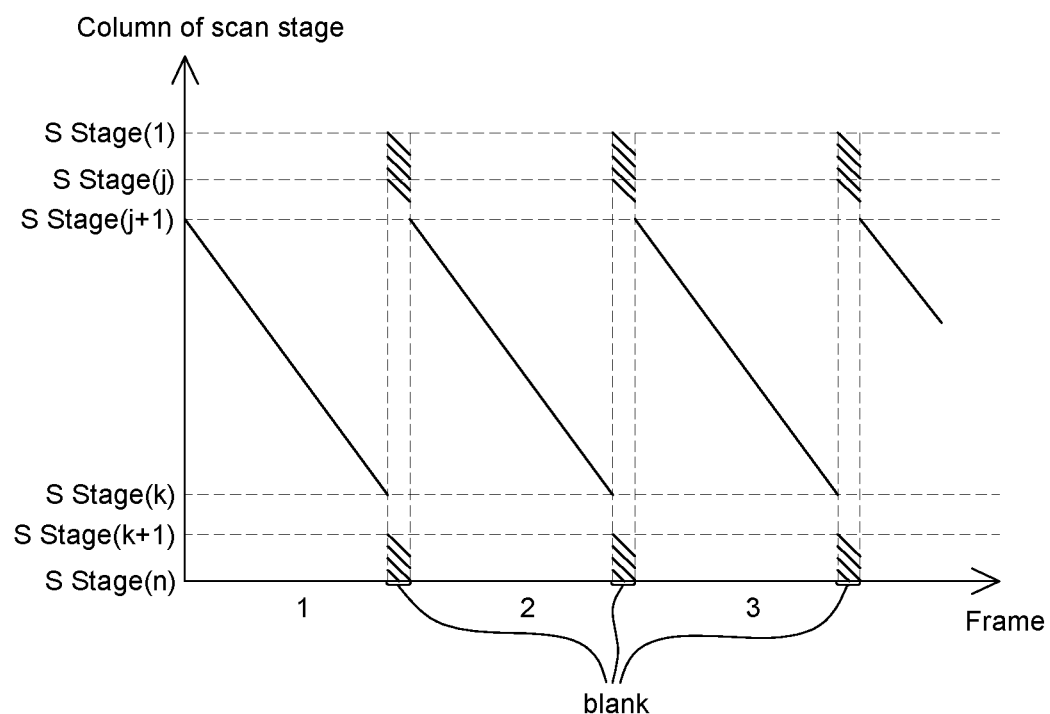
FIG. 6B is a graph illustrating a driving sequence of FIG. 6A.

FIG. 6B is a graph illustrating a driving sequence of the scan stage S Stage illustrated in FIG. 6A.

Referring to FIG. 6B, the scan stages connected to the first area and the third area may be driven in a blank period, which is a preparatory period for preparing a subsequent frame, between each frames.

In detail, a signal is input to the scan stage connected to pixels disposed in the (j+1) th row of the second area and then, the (j+1) th scan stage to the kth scan stage connected to pixels disposed in the kth row are sequentially driven. And, all of the scan stages S Stage (1) to S Stage (j) and S Stage (k+1) to S Stage (n) connected to the first area and the third area may be driven at the same time.

That is, the scan stages connected to the first area and the third area are not driven while the scan stages connected to the second area, where pixels actually emit light in the partial driving mode, are driven. Instead, the scan stages connected to the first area and third area are driven in the blank period. Thus, the scan stages connected to the first area and the third area do not affect driving of the scan stages connected to the second area. Therefore, it is possible to suppress a delay of an output waveform of a scan stage.

Figure 7:
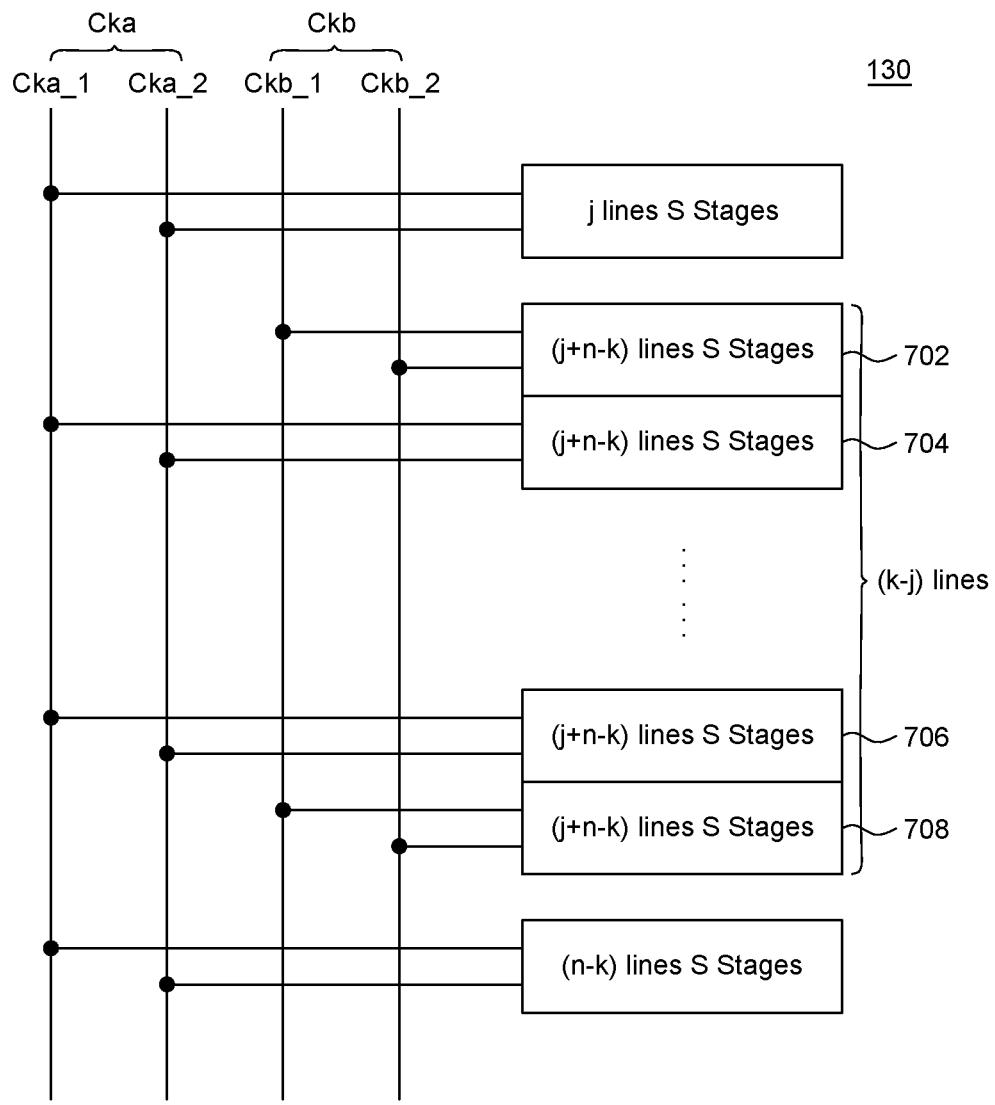
FIG. 7 is a block diagram illustrating a connection structure of clock signal lines of the scan driver according to an embodiment of the present disclosure.

FIG. 7 is a block diagram illustrating a connection structure of clock signal lines of the scan driver 130 according to an embodiment of the present disclosure.

Referring to FIG. 7, the scan driver 130 includes n numbers of scan stages. The first area may be connected to j number of scan stages, the second area may be connected to (k-j) number of scan stages, and the third area may be connected to (n-k) number of scan stages. In this case, when pixels disposed in the second area are in an on state, pixels disposed in the first area and the third area are in an off state.

A clock signal to be input to the scan stages includes a clock signal a (Cka) and a clock signal b (Ckb). The clock signal a (Cka) and the clock signal b (Ckb) have the same phase and are respectively generated by different amplifiers mounted in an integrated chip (IC) that generates a clock signal. For example, each of the clock signal a (Cka) and the clock signal b (Ckb) may be a 2-phase signal. The clock signal a (Cka) includes a clock signal a_1 (Cka_1) and a clock signal a_2 (Cka_2). The clock signal b (Ckb) includes a clock signal b_1 (Ckb_1) and a clock signal b_2 (Ckb_2). In this case, the phase of the clock signal is not limited to the 2-phase. And, the scan driver 130 includes a clock signal a line (Cka line) and a clock signal b line (Ckb line) to which the clock signal a (Cka) and the clock signal b (Ckb) may be applied.

Referring to the driving sequence of the scan driver illustrated in FIG. 4A and FIG. 4B, two scan stages connected to two rows are driven in the first period and the second period. That is, while the scan stages connected to the second area are sequentially driven, the scan stages connected to the first area and the third area are sequentially driven.

In order not to change the amount of load applied to clock signal lines while the scan stages are driven in the first period, the second period, and the third period, the clock signal lines may be connected to the scan stages as shown in FIG. 7. The clock signal line connections prevent clock signals generated by the same amplifier from being applied, in the first period and the second period, to two scan stages that are driven at the same time.

For example, referring back to FIG. 7, a clock signal a (Cka_1, Cka_2) line may be connected to each of the j number of scan stages and the (n-k) number of scan stages connected to the first area and the third area. And, a clock signal b (Ckb_1, Ckb_2) line may be connected to the first subset 702 of (j+n-k) number of scan stages in the second area which are driven at the same time as the scan stages connected to the first area and the third area. In this case, (j+n-k)×a (a is a natural number) equals (k-j).

And, the clock signal a (Cka_1, Cka_2) line and the clock signal b (Ckb_1, Ckb_2) line may be alternately connected to subsets 702-708 of scan stages driven in the third period. In the drawing, the clock signal a (Cka_1, Cka_2) line and the clock signal b (Ckb_1, Ckb_2) line are alternately connected to subsets 702-708 of scan stages, where each subset of scan stages includes (j+n-k) number of scan stages, but the present disclosure is not limited thereto. However, by making the total load applied to each of the clock signal a (Cka_1, Cka_2) line and the clock signal b (Ckb_1, Ckb_2) line identical to each other, it is possible to suppress a delay of a clock signal with greater load.

In this case, the clock signal a and the clock signal b may be referred to as a first clock signal and a second clock signal, respectively. The clock signal a line and the clock signal b line may be referred to as a first clock signal line and a second clock signal line, respectively.

That is, a first clock signal is applied to the first clock signal line and a second clock signal is applied to the second clock signal line. The second clock signal has the same phase as the first clock signal but is generated by an amplifier different from an amplifier that generates the first clock signal. Thus, the first clock signal and the second clock signal may be input to respective scan stages that are driven at the same time, so that it is possible to reduce load applied to the first clock signal line and the second clock signal line. And, the scan stages connected to the first area and the third area, and the scan stages connected to the second area, may become similar or almost identical in their degree of deterioration. Thus, it is possible to suppress the generation of line mura at the boundary between the first area and the second area and the boundary between the second area and the third area at the time of switching from the partial driving mode to the normal driving mode.

Figure 8:
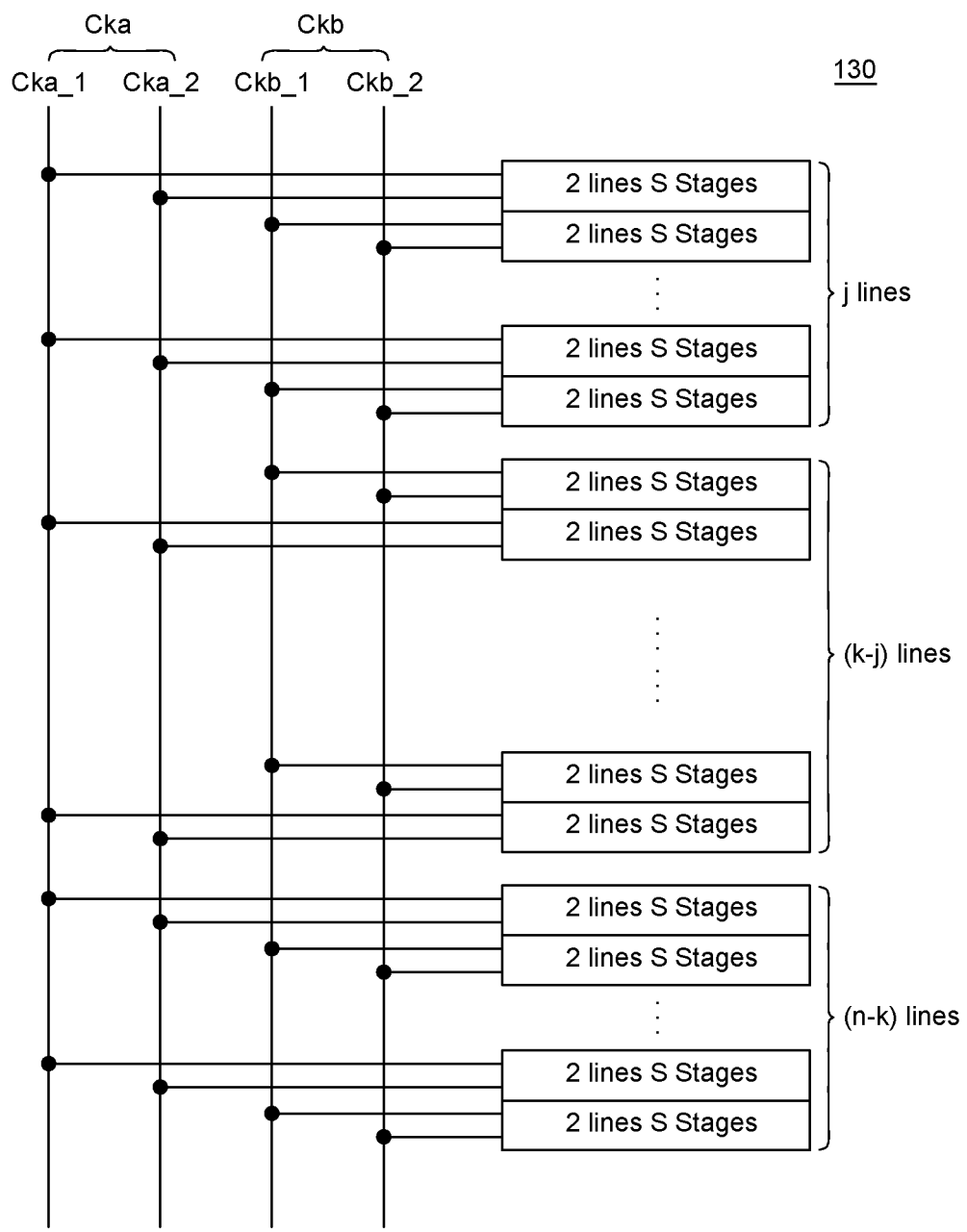
FIG. 8 is a block diagram illustrating a connection structure of clock signal lines of the scan driver according to another embodiment of the present disclosure.

FIG. 8 is a block diagram illustrating a connection structure of clock signal lines of the scan driver 130 according to another embodiment of the present disclosure.

Referring to FIG. 8, the scan driver 130 includes n numbers of scan stages. The first area may be connected to j number of scan stages, the second area may be connected to (k−j) number of scan stages, and the third area may be connected to (n−k) number of scan stages. In this case, when pixels disposed in the second area are in anon state, pixels disposed in the first area and the third area are in an off state.

A clock signal to be input to the scan stages includes a clock signal a (Cka) and a clock signal b (Ckb). The clock signal a (Cka) and the clock signal b (Ckb) have the same phase and are respectively generated by different amplifiers mounted in an integrated chip (IC) that generates a clock signal. For example, each of the clock signal a (Cka) and the clock signal b (Ckb) may be a 2-phase signal. The clock signal a (Cka) includes a clock signal a_1 (Cka_1) and a clock signal a_2 (Cka_2). The clock signal b (Ckb) includes a clock signal b_1 (Ckb_1) and a clock signal b_2 (Ckb_2). In some embodiments, the clock signal may have more than and fewer than two phases. And, the scan driver 130 includes a clock signal a line (Cka line) and a clock signal b line (Ckb line) to which the clock signal a (Cka) and the clock signal b (Ckb) may be applied.

Referring to the driving sequence of the scan driver illustrated in FIG. 4A and FIG. 4B, two scan stages connected to two rows are driven at the same time in the first period and the second period. That is, while the scan stages connected to the second area are sequentially driven, the scan stages connected to the first area and the third area are sequentially driven. Therefore, the clock signal lines may be connected to the scan stages so that the same clock signal is not applied, in the first and second periods, to two scan stages that are driven at the same time. That is, two scan stages to be driven at the same time are not connected to the same clock signal line, so that load is not increased. Thus, an output signal may not be delayed.

In case there are more than hundreds of rows included in the first area and the third area in FIG. 7, it may be difficult to adjust load applied to the clock signal a line with load applied to the clock signal b line. Therefore, in the embodiment in FIG. 8, clock signal lines are closely distributed in each scan stage as compared with the embodiment in FIG. 7. Thus, load applied to the clock signal lines can be precisely divided or distributed. For example, the clock signal a (Cka_1, Cka_2) line and the clock signal b (Ckb_1, Ckb_2) line may be alternately connected in sequence to subsets of two scan stages of the j number of scan stages connected to the first area, and alternately connected to subsets of (n−k) number of scan stages connected to the third area. And, the clock signal b (Ckb_1, Ckb_2) line and the clock signal a (Cka_1, Cka_2) line may be alternately connected in sequence to subsets of two scan stages of the (k−j) number of scan stages connected to the second area.

A case where the clock signal a line and the clock signal b line are alternately connected to subsets of two scan stages has been described as an example, but the present disclosure is not limited thereto. In another embodiment, the connections between the scan stages and the clock signal a line and the clock signal b line may alternate with each individual scan stage. More generically, the clock signal a line and the clock signal b line may be alternately connected to subsets of scan stages that have fewer than than (j+n−k) scan stages per subset, wherein j+n−k is the total number of the rows included in the first area and the third area.

In this case, different clock signal lines, i.e., the clock signal a line and the clock signal b line, are connected to the respective scan stages to be driven at the same time. The clock signal a and the clock signal b may be referred to as a first clock signal and a second clock signal, respectively. The clock signal a line and the clock signal b line may be referred to as a first clock signal line and a second clock signal line, respectively.

The first clock signal line and the second clock signal line, which are connected to the scan stages connected to the pixels disposed in the first and third areas and the scan stages connected to the pixels disposed in the second area, are alternately connected to m (m is a natural number) number of rows. Thus, it is possible to suppress the sharing of load applied to the first clock signal line and the second clock signal line. And, by adjusting load, it is possible to suppress a delay of an output waveform of a scan stage caused by a difference in load. Therefore, it is possible to suppress the generation of line mura at the boundary between the first area and the second area and the boundary between the second area and the third area at the time of switch from the partial driving mode to the normal driving mode.

The embodiments of the present disclosure can also be described as follows:

According to an embodiment of the present disclosure, there is provided a display panel. The display panel comprises a substrate including a first area and a second area, a gate driver configured to supply a gate signal to pixels disposed on the substrate, the gate driver having a plurality of stages, and a first clock signal line and a second clock signal line to be respectively applied with a first clock signal and a second clock signal having a same phase. The plurality of stages are connected to the first area and the second area and driven at the same time. The first clock signal line and the second clock signal line are connected to each of the plurality of stages connected to the first area and the second area. Thus, the stages connected to the first area and the second area become similar or almost identical in the degree of deterioration. And, it is possible to suppress the generation of line mura at a boundary between the first area and the second area at the time of switch from a partial driving mode to a normal driving mode.

According to one or more embodiments, the pixels in the first area of the display panel may be in an off state and the pixels in the second area may be in an on state.

According to one or more embodiments, the gate driver may include an emission driver and a scan driver. The plurality of stages may constitute the scan driver. The plurality of stages connected to the pixels in the first area may be connected to the first clock signal line and the plurality of stages connected to the pixels in the second area may be connected to the second clock signal line.

According to one or more embodiments, the second area of the display panel may further include a plurality of stages connected to the first clock signal line.

According to one or more embodiments, the gate driver may include an emission driver and a scan driver. The plurality of stages may constitute the scan driver. The first clock signal line and the second clock signal line respectively connected to the plurality of stages connected to the pixels in the first area and a plurality of stages connected to the pixels in the second area may be alternately connected to every m (m<(j+n−k), j<k<n, where j, k, m and n are natural numbers) number of rows.

According to one or more embodiments, the substrate may further include a third area. The pixels in the first area and the third area may be in an off state and pixels in the second area may be in an on state.

According to one or more embodiments, the gate driver may include an emission driver and a scan driver. The plurality of stages may constitute the scan driver. The plurality of stages connected to the pixels in the first area and the third area may be connected to the first clock signal line and the plurality of stages connected to the pixels in the second area may be connected to the second clock signal line.

According to one or more embodiments, a line may be connected to provide an output signal of a stage connected to pixels in a last row of the first area of the display panel to be input to a stage connected to pixels in a first row of the third area.

According to one or more embodiments, the second area of the display panel may further include a plurality of stages connected to the first clock signal line.

According to one or more embodiments, the gate driver may include an emission driver and a scan driver. The plurality of stages may constitute the scan driver. The first clock signal line and the second clock signal line respectively connected to a plurality of stages connected to the pixels in the first area and the third area and the plurality of stages connected to the pixels in the second area may be alternately connected to every m (m<(j+n−k), j<k<n, where j, k, m and n are natural numbers) number of rows.

According to one or more embodiments, the gate driver may further include a dummy stage. A dummy stage may be connected to a stage connected to an area of a smaller number of rows among the first area and the second area.

According to one or more embodiments, a load applied to the first clock signal line and a load applied to the second clock signal line may be identical to each other.

According to an embodiment of the present disclosure, there is provided a display panel. The display panel comprises a substrate including a first area and a second area, a gate driver configured to supply a gate signal to pixels disposed on the substrate, the gate driver comprising a plurality of stages, and a first clock signal line configured to apply a first clock signal and a second clock signal line configured to apply a second clock signal to the gate driver. While pixels in the first area are in an off state, the first clock signal line is connected to one or more stages of the plurality of stages connected to the pixels, the one or more stages connected to the pixels in the first area. Thus, the gate drivers connected to the first area and the second area become similar or almost identical in the degree of deterioration. Also, it is possible to suppress the generation of line mura at a boundary between the first area and the second area at the time of switch from a partial driving mode to a normal driving mode.

According to one or more embodiments, the pixels in the second area of the display panel may be in an on state.

According to one or more embodiments, the first clock signal and the second clock signal may be respectively generated by different amplifiers and may have a same phase.

According to one or more embodiments, the first area of the display panel may include j (j is natural number) number of rows and the second area may include more than j number of rows. And the plurality of stages connected to pixels in a first row to a j th row in the second area may be connected to the second clock signal line.

According to one or more embodiments, the first clock signal and the second clock signal may be simultaneously input to each of the plurality of stages connected to the pixels in the first area and the plurality of stages connected to pixels in the second area.

According to one or more embodiments, the gate driver may further include a dummy stage. The dummy stage may be connected to a stage connected to an area of a smaller number of rows among the first area and the second area.

According to one or more embodiments, a line may be connected in order for an output signal of a stage connected to pixels in a last row of the second area of the display panel to be input to a stage connected to pixels in a first row of the first area.

According to one or more embodiments, a load applied to the first clock signal line and a load applied to the second clock signal line may be identical to each other.

According to another embodiment of the present disclosure, a display panel comprises a plurality of first pixel rows, a plurality of second pixel rows, a first clock signal line to carry a first clock signal, and a second clock signal line to carry a second clock signal that is in phase with the first clock signal. A gate driver includes a plurality of first gate driver stages connected to the plurality of first pixel rows, and a plurality of second gate driver stages connected to the plurality of second pixel rows. A first gate driver stage of the plurality of first gate driver stages is driven at a same time as a second gate driver stage of the plurality of second gate driver stages. The first gate driver stage is connected to the first clock signal line and the second gate driver stage is connected to the second clock signal line.

According to one or more embodiments, a display panel may further comprise a plurality of third pixel rows. The gate driver may comprise a plurality of third gate driver stages connected to the plurality of third pixel rows. A third gate driver stage of the plurality of third gate driver stages may be driven at a same time as an additional second gate driver stage of the plurality of second gate driver stages. And the third gate driver stage may be connected to the first clock signal line.

According to one or more embodiments, the second pixel rows may be between the first pixel rows and the third pixel rows. The display panel may further include a signal line to provide an output signal of a last gate driver stage of the plurality of first gate driver stages to an input of an initial gate driver stage of the plurality of third gate driver stages.

According to one or more embodiments, the gate driver may further include a dummy driver stage and a signal line to provide an output signal of a last gate driver stage of the plurality of third gate driver stages to an input of the dummy driver stage.

According to one or more embodiments, the plurality of first gate driver stages may be driven sequentially. The plurality of second gate driver stages may be driven sequentially at a same time as the plurality of first gate driver stages. The plurality of first gate driver stages may be connected to the first clock signal line and the plurality of second gate driver stages are connected to the second clock signal line.

According to one or more embodiments, the plurality of first gate driver stages may include 1st to jth gate driver stages. The plurality of second gate driver stages may include at least a j+1th gate driver stage.

According to one or more embodiments, the plurality of first gate driver stages may be driven sequentially. The plurality of second gate driver stages may be driven sequentially at a same time as the plurality of first gate driver stages being driven sequentially. Subsets of the plurality of first gate driver stages may be connected in alternating manner to the first clock signal line and the second clock signal line. Subsets of the plurality of second gate driver stages may be connected in alternating manner to the second clock signal line and the first clock signal line.

According to one or more embodiments, a load applied to the first clock signal line and a load applied to the second clock signal line may be identical to each other.

According to one or more embodiments, the gate driver may be a scan driver.

According to one or more embodiments, while the first gate driver stage and the second gate driver stage may be driven, pixels in the first pixel rows may be in an off state and pixels in the second pixels rows are in an on state.

According to one or more embodiments, a display panel comprises a plurality of first pixel rows corresponding to a plurality of first gate lines. A plurality of second pixel rows correspond to a plurality of second gate lines. A gate driver has a plurality of first gate driver stages connected to the plurality of first gate lines and a plurality of second gate driver stages connected to the plurality of second gate lines. The plurality of second gate driver stages are driven sequentially, and all first gate driver stages of the plurality of first gate driver stages are driven at the same time.

According to one or more embodiments, the display panel may comprise a plurality of third pixel rows corresponding to a plurality of third gate lines. The gate driver may comprise a plurality of third gate driver stages connected to the plurality of third pixel rows via the plurality of third gate lines. All first gate driver stages of the plurality of first gate driver stages and all third gate driver stages of the plurality of third gate driver stages may be driven at a same time.

According to one or more embodiment, the plurality of first gate driver stages may be driven in a blank period.

According to one or more embodiments, a signal line may provide an output signal of a last gate driver stage of the plurality of second gate driver stages to inputs of each first gate driver stage of the plurality of first gate driver stages.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display panel comprising:
   a substrate including a first area and a second area;
   a gate driver configured to supply a gate signal to pixels disposed on the substrate, the gate driver having a plurality of stages; and
   a first clock signal line and a second clock signal line to be respectively applied with a first clock signal and a second clock signal having a same phase,
   wherein the plurality of stages are connected to the first area and the second area and driven at the same time, and the first clock signal line and the second clock signal line are connected to each of the plurality of stages connected to the first area and the second area;
   wherein the pixels in the first area are in an off state and the pixels in the second area are in an on state.

2. The display panel according to claim 1, wherein the gate driver includes an emission driver and a scan driver, the plurality of stages constitute the scan driver, the plurality of stages connected to the pixels in the first area are connected to the first clock signal line, and the plurality of stages connected to the pixels in the second area are connected to the second clock signal line.

3. The display panel according to claim 2, wherein the second area further includes a plurality of stages connected to the first clock signal line.

4. The display panel according to claim 1, wherein the gate driver includes an emission driver and a scan driver, the plurality of stages constitute the scan driver, the first clock signal line and the second clock signal line respectively connected to the plurality of stages connected to the pixels in the first area and the plurality of stages connected to the pixels in the second area are alternately connected to every m ($m<(j+n-k)$, $j<k<n$, where j, k, m and n are natural numbers) number of rows.

5. The display panel according to claim 1, wherein the substrate further includes a third area, and the pixels in the first area and the third area are in an off state and pixels in the second area are in an on state.

6. The display panel according to claim 5, wherein the gate driver includes an emission driver and a scan driver, the plurality of stages constitute the scan driver, the plurality of stages connected to the pixels in the first area and the third area are connected to the first clock signal line, and the plurality of stages connected to the pixels in the second area are connected to the second clock signal line.

7. The display panel according to claim 6, wherein a line is connected to provide an output signal of a stage connected to pixels in a last row of the first area to be input to a stage connected to pixels in a first row of the third area.

8. The display panel according to claim 6, wherein the second area further includes a plurality of stages connected to the first clock signal line.

9. The display panel according to claim 5, wherein the gate driver includes an emission driver and a scan driver, the plurality of stages constitute the scan driver, the first clock signal line and the second clock signal line respectively connected to a plurality of stages connected to the pixels in the first area and the third area and the plurality of stages connected to the pixels in the second area are alternately connected to every m ($m<(j+n-k)$, $j<k<n$, where j, k, m and n are natural numbers) number of rows.

10. The display panel according to claim 1, wherein the gate driver further includes a dummy stage, and the dummy stage is connected to a stage connected to an area of a smaller number of rows among the first area and the second area.

11. The display panel according to claim 1, wherein a load applied to the first clock signal line and load applied to the second clock signal line are identical to each other.

12. A display panel comprising:
   a plurality of first pixel rows;
   a plurality of second pixel rows;
   a first clock signal line to carry a first clock signal;
   a second clock signal line to carry a second clock signal that is in phase with the first clock signal;
   a gate driver having:
      a plurality of first gate driver stages connected to the plurality of first pixel rows; and
      a plurality of second gate driver stages connected to the plurality of second pixel rows,
      wherein a first gate driver stage of the plurality of first gate driver stages is driven at a same time as a second gate driver stage of the plurality of second gate driver stages, wherein the first gate driver stage is connected to the first clock signal line and wherein the second gate driver stage is connected to the second clock signal line;

wherein, while the first gate driver stage and the second gate driver stage are driven, pixels in the plurality of first pixel rows are in an off state and pixels in the plurality of second pixels rows are in an on state.

13. The display panel of claim 12, further comprising:
a plurality of third pixel rows;
wherein the gate driver comprises a plurality of third gate driver stages connected to the plurality of third pixel rows, wherein a third gate driver stage of the plurality of third gate driver stages is driven at a same time as an additional second gate driver stage of the plurality of second gate driver stages, wherein the third gate driver stage is connected to the first clock signal line.

14. The display panel of claim 13, wherein the second pixel rows are between the first pixel rows and the third pixel rows, and further comprising:
a signal line to provide an output signal of a last gate driver stage of the plurality of first gate driver stages to an input of an initial gate driver stage of the plurality of third gate driver stages.

15. The display panel of claim 14, wherein the gate driver further includes:
a dummy driver stage; and
a signal line to provide an output signal of a last gate driver stage of the plurality of third gate driver stages to an input of the dummy driver stage.

16. The display panel of claim 12, wherein:
the plurality of first gate driver stages are driven sequentially,
the plurality of second gate driver stages are driven sequentially at a same time as the first gate driver stages, and
the plurality of first gate driver stages are connected to the first clock signal line and the plurality of second gate driver stages are connected to the second clock signal line.

17. The display panel of claim 16, wherein:
the plurality of first gate driver stages include $1^{st}$ to jth gate driver stages, wherein j is a natural number, and
the plurality of second gate driver stages include at least a j+1th gate driver stage.

18. The display panel of claim 12, wherein:
the plurality of first gate driver stages are driven sequentially,
the plurality of second gate driver stages are driven sequentially, the plurality of first gate driver stages being driven sequentially at a same time as the plurality of second gate driver stages being driven sequentially,
subsets of the plurality of first gate driver stages are connected in alternating manner to the first clock signal line and the second clock signal line, and
subsets of the plurality of second gate driver stages are connected in alternating manner to the second clock signal line and the first clock signal line.

19. The display panel of claim 12, wherein a load applied to the first clock signal line and load applied to the second clock signal line are identical to each other.

20. The display panel of claim 12, wherein the gate driver is a scan driver.

21. The display panel of claim 1, wherein the plurality of stages output the gate signal to the first area and the second area at the same time, and the gate signal is supplied to gate electrodes of transistors included in the pixels in the first area and the second area.

* * * * *